US008030924B2

(12) United States Patent
Bito et al.

(10) Patent No.: US 8,030,924 B2
(45) Date of Patent: Oct. 4, 2011

(54) MAGNETIC RESONANCE IMAGING SYSTEM

(75) Inventors: Yoshitaka Bito, Kokubunji (JP); Hisaaki Ochi, Kodaira (JP); Yo Taniguchi, Kokubunji (JP); Satoshi Hirata, Kokubunji (JP); Toru Shirai, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 1183 days.

(21) Appl. No.: 11/797,878

(22) Filed: May 8, 2007

(65) Prior Publication Data

US 2008/0009703 A1 Jan. 10, 2008

(30) Foreign Application Priority Data

May 11, 2006 (JP) ................................ 2006-132085

(51) Int. Cl.
G01V 3/00 (2006.01)
(52) U.S. Cl. ........................................ 324/312; 324/309
(58) Field of Classification Search .................. 324/312, 324/309
See application file for complete search history.

(56) References Cited

U.S. PATENT DOCUMENTS

| 5,561,724 | A | 10/1996 | Kido et al. | |
|---|---|---|---|---|
| 5,602,934 | A * | 2/1997 | Li et al. | 382/128 |
| 5,835,618 | A | 11/1998 | Fang et al. | |
| 7,620,261 | B2 * | 11/2009 | Chiang et al. | 382/260 |
| 2004/0073112 | A1 | 4/2004 | Azuma et al. | |

FOREIGN PATENT DOCUMENTS

| JP | 6-348842 | 6/1993 |
|---|---|---|
| JP | 10-124664 | 9/1997 |
| JP | 2001-8919 | 7/1999 |
| JP | 2004-129773 | 10/2002 |

OTHER PUBLICATIONS

Pohmann, R. and von Kienlin, Markus, "Accurate Phosphorus Metabolite Images of the Human Heart by 3D Acquisition-Weighted CSI", Magnetic Resonance in Medicine, vol. 45(5) 2001, pp. 817-826.

Jin, R., Zhang, L., Meng, B., Song, E., Xu, X., and Hung-C., "A Weighted Average Algorithm for Edge-Preserving Smoothing on MRI Images", Progress in Biomedical Optics and Imaging—Proceedings of SPIE; Medical Imaging 2006: Image Processing 2006, Joseph M. Reinhardt and Josien P. W. Pluim (eds.), Proc. of SPIE, vol. 6144 III (Mar. 20, 2006).

Pan, J., Hetherington, H., Vaughan, J., Mitchell, G., Pohost, G., and Whitaker, J., "Evaluation of Multiple Sclerosis by [1] H Spectroscopic Imaging at 4.1 T", Magnetic Resonance in Medicine, vol. 36(1), 1996, pp. 72-77.

(Continued)

Primary Examiner — Louis Arana
(74) Attorney, Agent, or Firm — Stites & Harbison PLLC; Juan Carlos A. Marquez, Esq.

(57) ABSTRACT

A magnetic resonance imaging system capable of conducting spectroscopic imaging with an improved SNR without degrading the spatial resolution includes edge-preserving filter processing means for spectroscopic imaging. The edge-preserving filter processing means executes processing including the steps of calculating spectral similarity in spatial neighborhoods (spatially neighboring voxels) at each voxel in spectroscopic imaging data, calculating a spectral weight according to the spectral similarity, and conducting weighted smoothing for compounding spectra of spatial neighborhoods (spatially neighboring voxels) according to the spectral weight.

8 Claims, 14 Drawing Sheets

OTHER PUBLICATIONS

Extended European Search Report dated Sep. 5, 2007.

Bonny, Jean-Marie et al. "Multi-exponential analysis of magnitude MR images using a quantitative multispectral edge-preserving filter", Journal of Magnetic Resonance vol. 161, 2003, pp. 25-34.

Kamiyama, Naohisa et al. "Method of small structure extraction from the ultrasound RF signal by using statistic analogy between echo signals", The Japan Society of Ultrasonics in Medicine, Basic Technology study group paper, Medical Systems R&D Center, Toshiba Co., 2001, pp. 14-18, with English abstract.

* cited by examiner

MAGNETIC RESONANCE IMAGING SYSTEM

INCORPORATION BY REFERENCE

The present application claims priority from Japanese application JP2006-132085 filed on May 11, 2006, the content of which is hereby incorporated by reference into this application.

BACKGROUND OF THE INVENTION

The present invention relates to a magnetic resonance imaging system (MRI system). In particular, the present invention relates to data processing of spectroscopic imaging for measuring molecular distribution.

The magnetic resonance imaging system is a system which transmits a radio frequency electromagnetic field (RF) having a specific frequency to a measurement subject placed in a static magnetic field, thereby induces a magnetic resonance phenomenon, and acquires physical and chemical information of the measurement subject. Magnetic resonance imaging (MRI) that is widely spread at the present time is a method of mainly using the magnetic resonance phenomenon of the proton (1H) in the water molecule and imaging the difference in proton density and relaxation time which differ depending upon tissues. In addition, a method of measuring the map of each molecule containing not only the proton density but also the proton or phosphorus (31P), called spectroscopic imaging is also proposed. This is a method of separating magnetic resonance signals of each molecule on the basis of a difference of the magnetic resonance frequency (chemical shift) caused by a difference of molecular chemical bond, and imaging the density and relaxation time of each molecule. It is considered that this method makes possible a more precise diagnosis of diseases as compared with the case where the MRI is used. For example, it is considered that the diagnosis precision of cancers can be enhanced. In vigorously proliferating cancer tissues, a sufficient blood flow is not obtained. Accordingly, the anaerobic metabolism (glycolysis) is accelerated. As a result, the concentration of lactate is elevated. If the concentration of lactate is detected by using the spectroscopic imaging, then the difference of tissue metabolism can be observed and it becomes possible to distinguish vigorously proliferating cancer tissues from normal tissues and resting cancers. In cerebral ischemia, an increase of lactate is noticed even if the blood flow decreases slightly. Therefore, it is considered that the spectroscopic imaging makes it possible to accurately diagnose a region damaged by ischemia.

In general, however, the molecule which becomes the measurement object of the spectroscopic imaging is far lower in concentration than the water molecule. This results in a problem that the signal-to-noise ratio (SNR) is low. As compared with the ordinary MRI, the spatial resolution is made low and signal averaging is conducted with an ample measurement time. However, it cannot be said yet that a sufficient SNR is obtained. For example, in 1H spectroscopic imaging in the case of a typical 1.5 T MRI system, the number of voxels becomes approximately 32×32 with a spatial distribution of 1 cm cube and the SNR becomes approximately 0.1 with a measurement time of approximately 10 minutes. If smoothing processing of calculating the spatially moving averaging is conducted in order to increase the SNR, the spatial resolution falls extremely. If the spatial resolution is at least 1 cm, it becomes difficult to distinguish a small cancer tissue with high precision because of the partial volume effect. The "partial volume effect" means an effect that small changes of tissue contained in each voxel are decreased by influences of other most signals. In a diagnosis of conducting tissue classification with high precision, it is needed to improve the SNR without degrading the spatial resolution.

As for ordinary images, several edge-preserving filters have been proposed as the method for improving the SNR without degrading the spatial resolution. For example, as a well-known method, a median filter which selects a median from among spatial neighborhood (spatially neighboring voxels) in the object spatial dimensions can be mentioned. Besides, in JP-B-3472596 corresponding to U.S. Pat. No. 5,561,724, a method of detecting a dimension having a less concentration change from object spatial dimensions and conducting smoothing processing in the dimension alone is described.

In Kamiyama etc., "Method of small structure extraction from the ultrasound RF signal by using statistic analogy between echo signals," The Japan Society of Ultrasonics in Medicine, Basic Technology study group paper, pp. 14-18, 2001, a method of reducing speckles in ultrasound imaging and conducting weighted smoothing is described. In this method, a higher weight is provided as the data value of an object voxel (also referred to as pixel) is similar to data values of neighboring voxels.

In JP-A-2004-129773 (corresponding to US 2004/0073112), a method of weighting and combining two images obtained by weighted smoothing which provides voxels having similar data values with higher weights and structure enhancing processing is described.

In JP-A-10-124664 (corresponding to U.S. Pat. No. 5,835,618), a filter which does hot lose a structure even if the dynamic range is conversely compressed is described.

In Bonny J M etc., "Multi-exponential analysis of magnitude MR images using a quantitative multispectral edge-preserving filter," Journal of Magnetic Resonance, vol. 161, pp. 25-34 (2003), a method of utilizing an edge-preserving filter in order to measure the relaxation time using the MRI with high precision is proposed. For measuring the relaxation time, different measurements of the echo time are repeated and data having a plurality of signal values for each pixel are acquired. The relaxation time which is an attenuation factor is calculated from the decay of the signal value with the echo time. At this time, multiple values of each pixel are handled as multi-dimensional values, the multi-dimensional values for the object spatial dimensions are weighted according to similarity of the multi-dimensional value in the neighborhood and smoothed.

In JP-A-2001-8919, a method for improving the spatial resolution while preserving the SNR with respect to spectroscopic imaging data is described. Data are filled into a higher k-space by conducting linear prediction of data in a k-space dimension corresponding to the spatial dimension. As a result, it becomes possible to suppress Gibbs ringing as compared with the case where the higher k-space is filled with values 0 by zero-filling.

SUMMARY OF THE INVENTION

In the edge-preserving filter for ordinary images, it is difficult to improve the SNR without degrading the spatial resolution for the spectroscopic imaging data.

The spectroscopic image is multi-dimensional data in the spatial dimension and the chemical shift dimension. In the chemical shift dimension, sharp peaks are formed for each molecule. Two problems occur in a median filter for normal images and an edge-preserving filter proposed in JP-A-10-124664 (corresponding to U.S. Pat. No. 5,835,618) and Kamiyama etc., "Method of small structure extraction from the ultrasound RF signal by using statistic analogy between echo signals," The Japan Society of Ultrasonics in Medicine, Basic Technology study group paper, pp. 14-18, 2001. As for one of the two problems, the signal value changes greatly in the chemical shift dimension in a voxel where the signal intensity slightly falls from the peak, whereas in the spatial dimension the SNR is low and consequently little smoothing processing is conducted, improvement of the SNR being impossible. As for the other of the two problems, the spectrum in the chemical shift dimension becomes broad and it becomes difficult to distinguish the molecule.

In JP-B-3472596 corresponding to U.S. Pat. No. 5,561, 724, a dimension having a small change in signal intensity must be detected. In addition to the problem of handling in the chemical shift dimension, there is also a problem that detection of a dimension having a small signal intensity change is difficult because of a low spatial resolution of the spectroscopic imaging data and a small number of pixels.

In Bonny J M etc., "Multi-exponential analysis of magnitude MR images using a quantitative multispectral edge-preserving filter," Journal of Magnetic Resonance, vol. 161, pp. 25-34 (2003), an edge-preserving filter which conducts weighting according to similarities of a plurality of data values, if any for each voxel, and smoothes the data values is proposed. If this method is applied to spectroscopic imaging, however, there is a problem that the molecular distribution difference falls. This is because the weighting depends upon the similarities of a plurality of data values and all spectra in the neighborhood are added. In some cases, therefore, weighting depends upon, for example, high signal intensity molecular distribution and low signal intensity molecular distribution is blurred.

In the JP-A-2001-8919, there is a problem that the spatial resolution can be improved, but the SNR cannot be improved.

An object of the present invention is to provide a spectroscopic imaging edge-preserving filter which improves the SNR without degrading the spatial resolution of the spectroscopic imaging data.

Another object of the present invention is to provide a magnetic resonance imaging system capable of conducting high spatial and spectral resolution and high SNR spectroscopic imaging by incorporating the edge-preserving filter.

A magnetic resonance imaging system according to the present invention includes static magnetic field generating means for generating a static magnetic field, transmit means for transmitting a radio frequency electromagnetic field to a measurement object placed in the static magnetic field, receive means for receiving a magnetic resonance signal from the measurement object, and data processing means for generating spectroscopic imaging data of the measurement object by using the magnetic resonance signal received by the receive means. The data processing means includes edge-preserving filter processing means for spectroscopic imaging. The edge-preserving filter processing means for spectroscopic imaging executes processing including the steps of calculating spectral similarity in spatial neighborhoods (spatially neighboring voxels) at each voxel in spectroscopic imaging data, calculating a spectral weight according to the similarity, and conducting weighted smoothing for compounding spectra of spatial neighborhoods (spatially neighboring voxels) according to spectral weights.

A magnetic resonance imaging system according to the present invention includes data processing means of magnetic resonance data, the data processing means includes edge-preserving filter processing means for spectroscopic imaging. The edge-preserving filter processing means for spectroscopic imaging executes processing including the steps of calculating spectral similarity in spatial neighborhoods (spatially neighboring voxels) at each voxel in spectroscopic imaging data, calculating a spectral weight according to the spectral similarity, and conducting weighted smoothing for compounding spectra of spatial neighborhoods (spatially neighboring voxels) according to the spectral weight.

The edge-preserving filter processing means for spectroscopic imaging in the magnetic resonance imaging system executes processing including the steps of calculating spectral similarity in spatial neighborhoods (spatially neighboring voxels) at each voxel in spectroscopic imaging data, calculating a spatial weight according to a spatial position relation between each voxel and the neighborhood, calculating a spectral weight according to the spectral similarity, multiplying the spatial weight and the spectral weight and calculating a spatio-spectral weight, and conducting weighted smoothing for compounding spectra of spatial neighborhoods (spatially neighboring voxels) according to the spatio-spectral weight.

The spectral similarity calculating step in the magnetic resonance imaging system includes calculating similarity in only a local spectrum concerning a chemical shift component of each voxel in the spectroscopic imaging data.

The spectral similarity calculating step in the magnetic resonance imaging system includes calculating spectral similarity by using a root mean square error (RMSE) defined on a spectrum or a RMSE defined on a local spectrum.

The edge-preserving filter processing means for spectroscopic imaging in the magnetic resonance imaging system executes processing including the steps of performing a Fourier transform on spectroscopic imaging data and thereby transforming the spectroscopic imaging data to k-space data, performing zero-filling in the k-space, and performing inverse Fourier transform on resultant data.

According to the magnetic resonance measuring imaging system and the magnetic resonance data processing unit according to the present invention, it becomes possible to improve the SNR without degrading the spatial resolution of spectroscopic imaging data. Furthermore, an effect that the spectrum resolution is not degraded at that time is also brought about.

Other objects, features and advantages of the invention will become apparent from the following description of the embodiments of the invention taken in conjunction with the accompanying drawings.

DESCRIPTION OF THE EMBODIMENTS

Hereafter, embodiments of the present invention will be described.

First Embodiment

Hereafter, a first embodiment of a magnetic resonance imaging system and a magnetic resonance data processing unit according to the present invention will be described.

Figure 1:
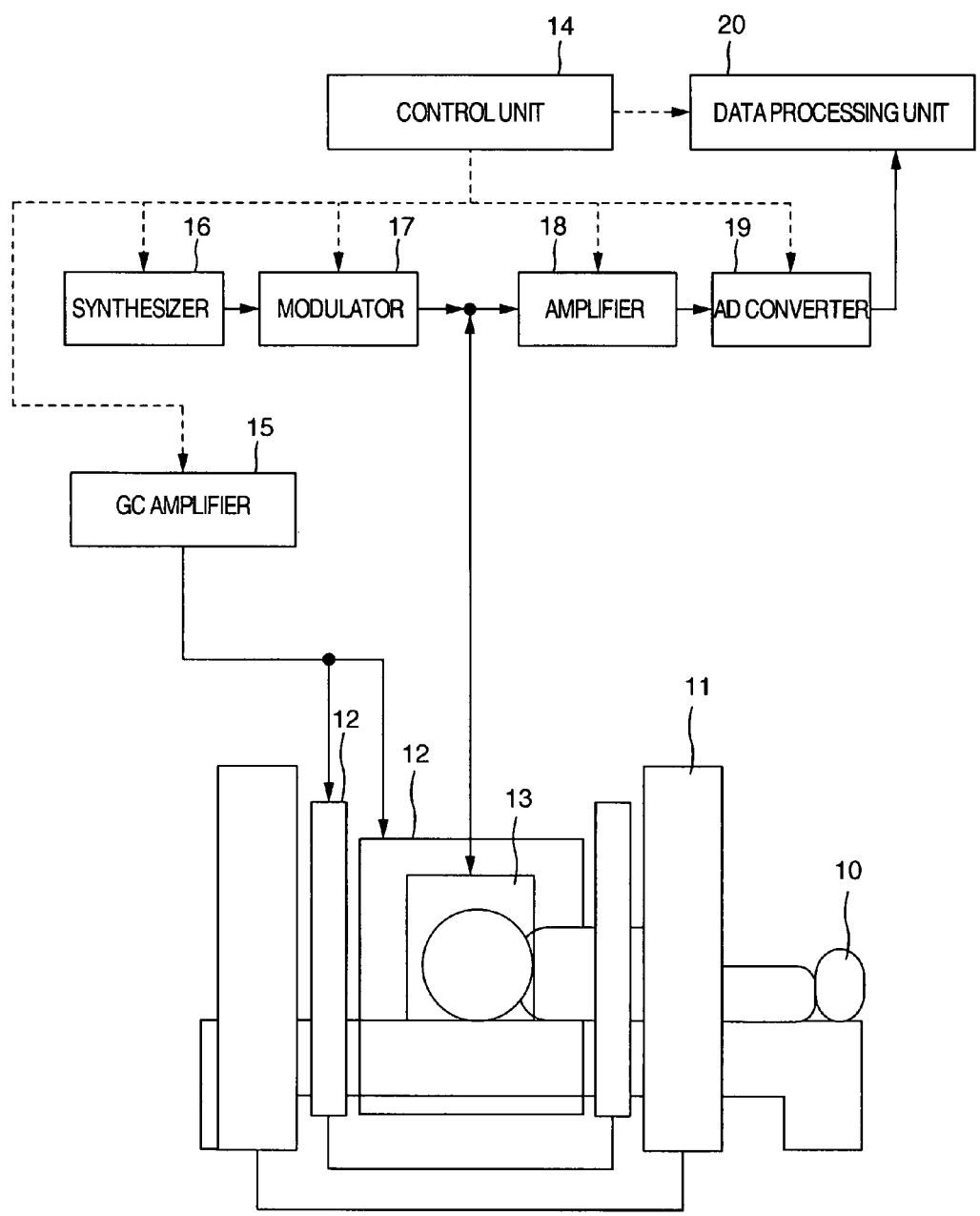
FIG. 1 is a diagram showing a configuration example of a magnetic resonance imaging system to which the present invention is applied.

FIG. 1 is a schematic general diagram of a magnetic resonance imaging system to which the present invention is applied. The magnetic resonance imaging system mainly includes a static magnetic field generating magnet 11, gradient coils 12, an RF system 13, a control unit 14, a GC amplifier 15, a synthesizer 16, a modulator 17, an amplifier 18, an AD converter 19, and a data processing unit 20.

The synthesizer 16 and the modulator 17 form a transmission unit. An RF generated by the synthesizer 16 is subjected to waveform shaping and power amplification in the modulator 17 to supply a current to the RF system 13, thereby generate an RF field, and excite nucleus spins of a measurement object 10.

The gradient coils 12 supplied with a current from the GC amplifier 15 generate a gradient field, and modulate a magnetic resonance signal supplied from the measurement object 10. The modulated signal is received by the RF system 13, and amplified by the amplifier 18. A signal acquired by the AD converter 19 is input to the data processing unit 20. The acquired data is subjected to data processing and retained in the data processing unit 20. The control unit 14 exercises control so as to operate respective units at timing and strengths programmed previously.

Figure 2:
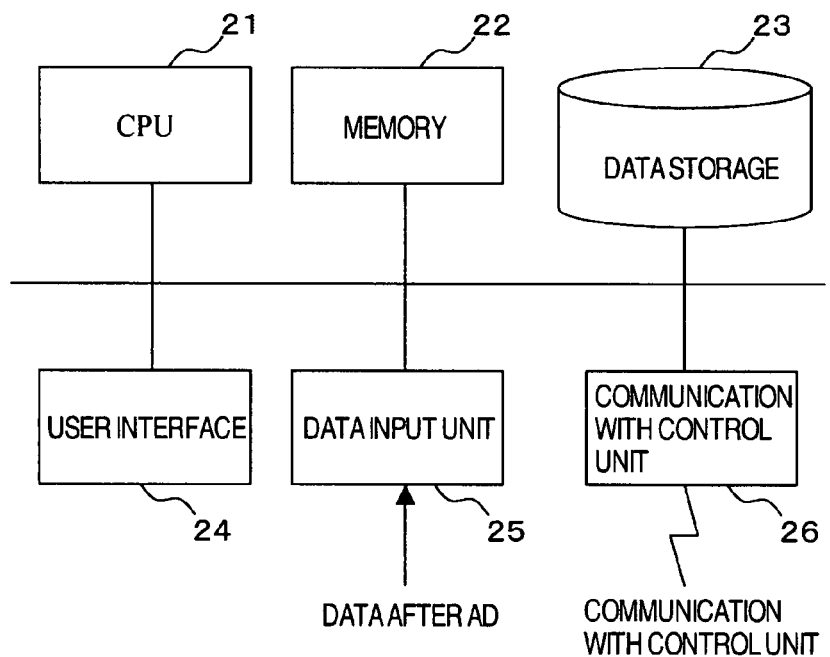
FIG. 2 is a diagram showing a configuration example of a magnetic resonance data processing unit to which the present invention is applied.

FIG. 2 shows a configuration example of the data processing unit. The data processing unit mainly includes a CPU 21, a memory 22, a data storage 23, a user interface 24, a data acquisition unit 25, and a network communication unit 26. The network communication unit 26 conducts communication with the control unit 14, receives a control signal from the control unit, and transmits a data processing situation as a control signal. Upon receiving a control signal for receiving data after the AD, the CPU 21 receives data after the AD via the data acquisition unit 25 and stores the data in the memory 22. In accordance with a preset data processing procedure, the CPU 21 processes the data and stores a result of the processing in the data storage 23.

The user interface 24 mainly includes a keyboard, a mouse, and a display. The user interface 24 accepts control from the user, and displays the data processing result. In response to a control signal accepted by the user interface 24, the CPU 21 calls data from the data storage 23 and retains the data in the memory 22. The CPU 21 retains a result of predetermined data processing in the memory 22, and outputs the data processing result to the user interface 24 or retains the data processing result in the data storage 23.

System configuration shown in FIGS. 1 and 2 represents a typical form, and the configuration is not restrictive. For example, the data processing unit 20 shown in FIG. 2 has two functions: a function of processing data at the time of measurement and a function of allowing the user to observe measured data and conduct data processing. However, it is also possible to form the latter-cited function as a separate independent magnetic resonance data processing unit.

Figure 3:
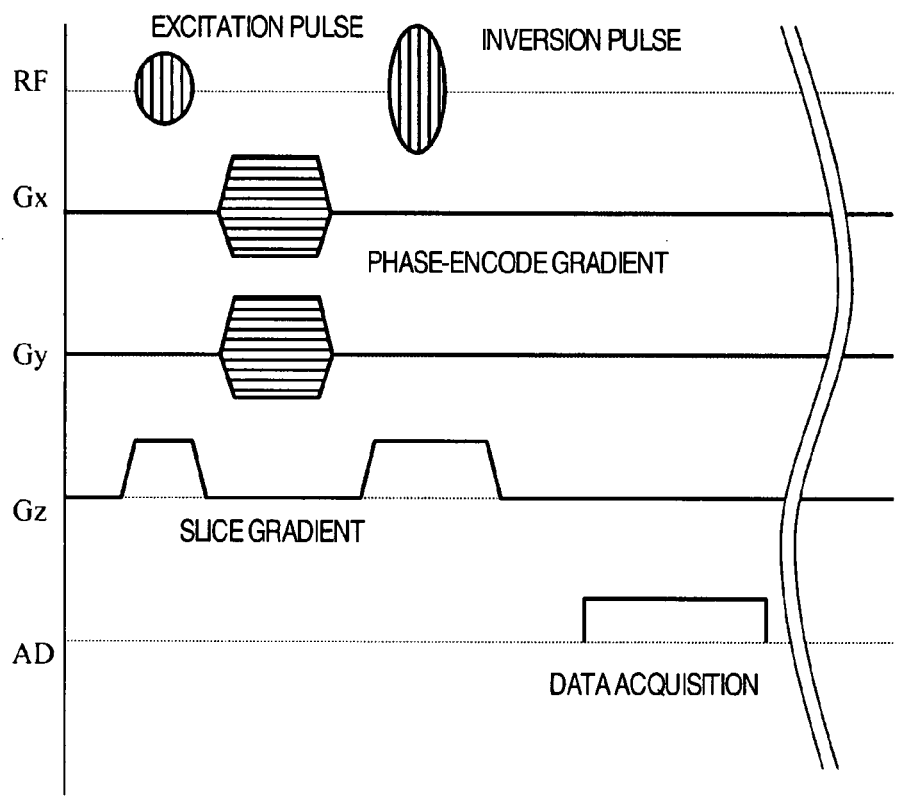
FIG. 3 is a diagram showing an imaging sequence of spectroscopic imaging used in the present invention.

The spectroscopic imaging method will now be described. FIG. 3 shows a typical example of an imaging sequence. The abscissa in FIG. 3 indicates time. The ordinate in FIG. 3 indicates the radio frequency electromagnetic field RF, gradient magnetic field Gx, Gy and Gz, and the data acquisition AD. The sequence diagram represents respective operation timing and amplitudes.

The sequence diagram will now be described by taking the two-dimensional phase-encoding method typically used in the spectroscopic imaging as an example. First, while applying the slice gradient Gz, an RF excitation pulse is applied. Subsequently, a phase-encode gradient is applied to each of Gx and Gy while changing it's amplitude in order to obtain spatial information in the x-dimension and y-dimension. Subsequently, an RF inversion pulse is applied while applying Gz. At this time as well, the amplitudes and phases of Gz and the RF inversion pulse are adjusted so as to invert the magnetic resonance signal excited by the excitation pulse. Then, data acquisition is conducted. This series of sequence is repeated while changing the phase encode intensity to acquire three-dimensional data of two spatial dimensions (kx, ky) and time t. The acquired data is sent to the data processing unit 20.

In the data processing unit, three-dimensional inverse Fourier transform is conducted to produce a spectroscopic image of two spatial dimensions (x, y) and the chemical shift c. The produced spectroscopic image is retained in the data storage 23 in the data processing unit.

Figure 4:
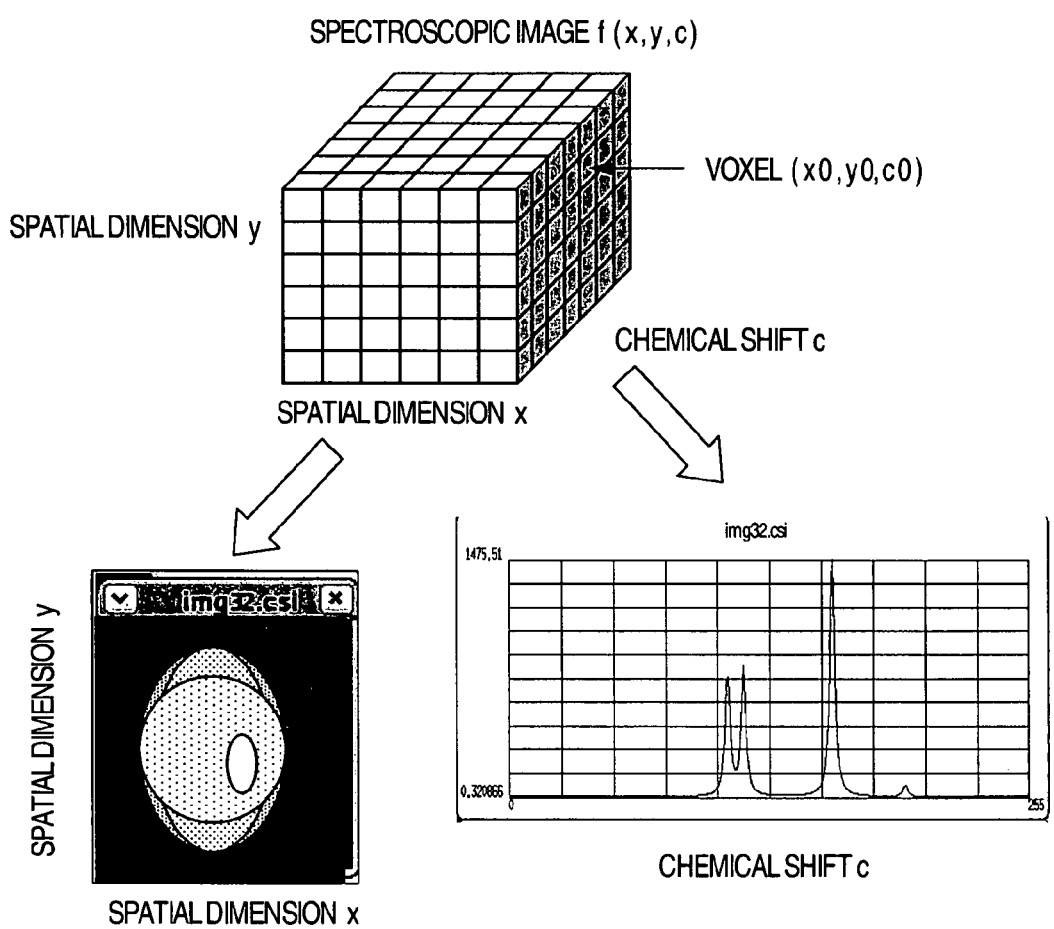
FIG. 4 is a diagram schematically showing spectroscopic imaging data to which the present invention is applied.

FIG. 4 shows a schematic diagram of a measured spectroscopic image. The spectroscopic image is represented as three-dimensional data formed of the spatial dimension x and y and the chemical shift c. Since each dimension becomes a distributed value, the three-dimensional data is represented as a set of small cubes (voxels) as shown in FIG. 4. When viewed in the chemical shift dimension, the three-dimensional data can be viewed as a spectrum which identifies the molecule as represented by a bottom right part of FIG. 4. For viewing the distribution of a certain molecule, it is also possible to project data corresponding to a peak of the spectrum to spatial dimensions x and y and view a distribution map as represented by a bottom left part of FIG. 4. Typically, a value retained by each voxel in three-dimensional data becomes a complex value because the magnetic resonance signal is an electromagnetic wave. In some cases, data processing of aligning phases of these complex values is conducted and values of respective voxels are retained as real values. In the ensuing description, a distinction will not be made between the complex values and the real values unless especially needed.

The imaging sequence of the spectroscopic imaging shown in FIG. 3 represents a typical example, and it is not restrictive. For example, it is also possible to use echo-planar spectroscopic imaging of fast scanning the three-dimensional measurement space (k-space) of kx, ky and t by using oscillating gradient. Furthermore, it is also possible to measure spectroscopic image of the spatial three dimensions and the chemical shift by apply the phase encode to Gz as well. In this case, the spectroscopic image shown in FIG. 4 is also represented as four-dimensional data of the spatial three dimensions and the chemical shift.

In the ensuing description, three-dimensional data of the spatial two dimensions (x, y) and the chemical shift one dimension is taken as an example in order to simplify the description. It is a matter of course that the spatial two dimensions can be changed to dimensions other than (x, y) or they can be expanded to spatial three dimensions.

Figure 5:
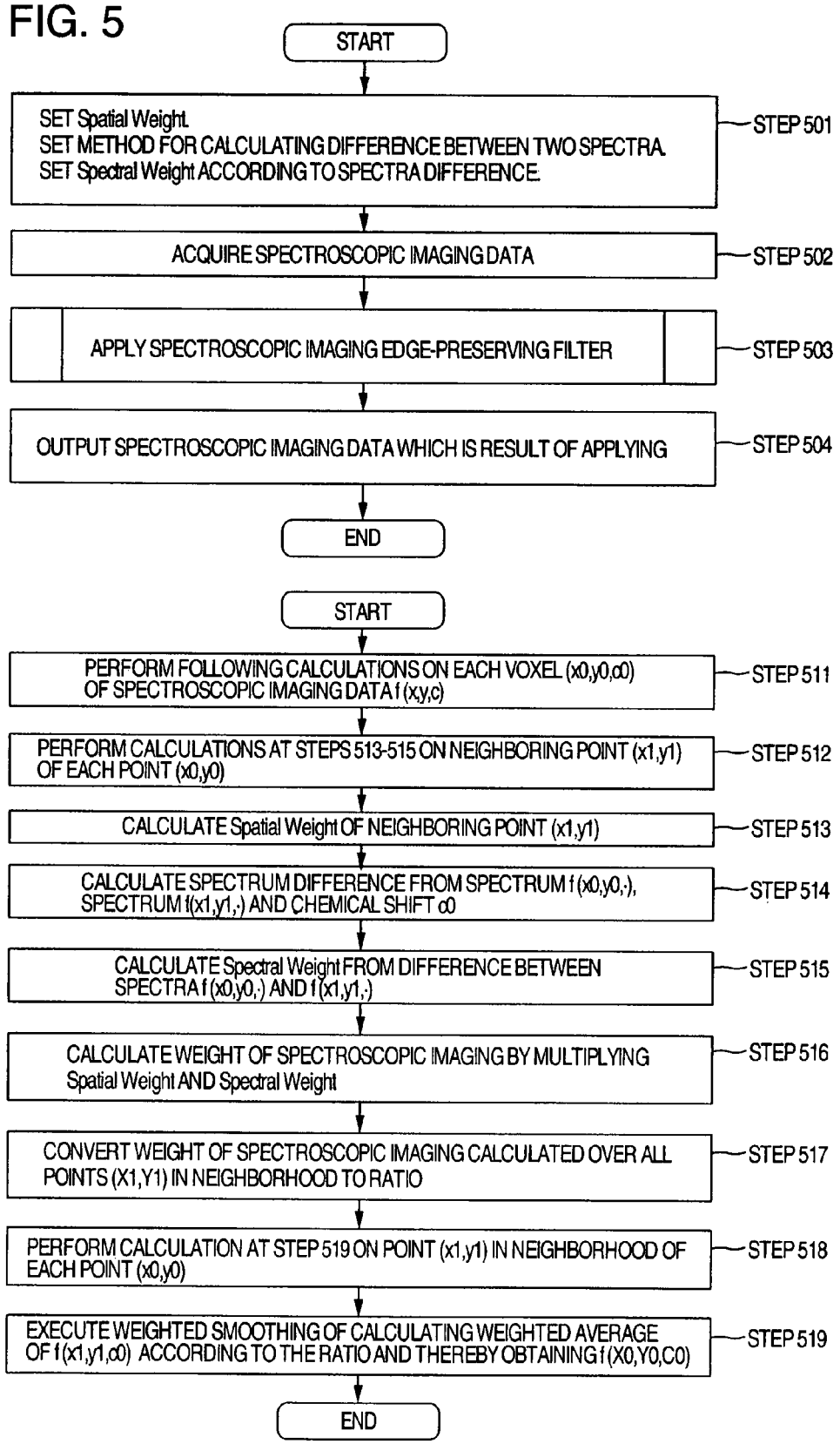
FIG. 5 is a flow chart of a spectroscopic imaging edge-preserving filter according to a first embodiment.

FIG. 5 shows a flow chart of a spectroscopic imaging edge-preserving filter. An upper part of FIG. 5 shows a general flow, whereas a lower part of FIG. 5 shows details of a place where the spectroscopic imaging edge-preserving filter is applied.

First, at step 501, parameters of the edge-preserving filter are set. These values may be set previously, or the values may be set on occasion at the time of data processing. Specifically, the spatial weight, a method for calculating a difference between two spectra, and the spectral weight are set. These parameters will be described with reference to FIG. 6.

Figure 6:
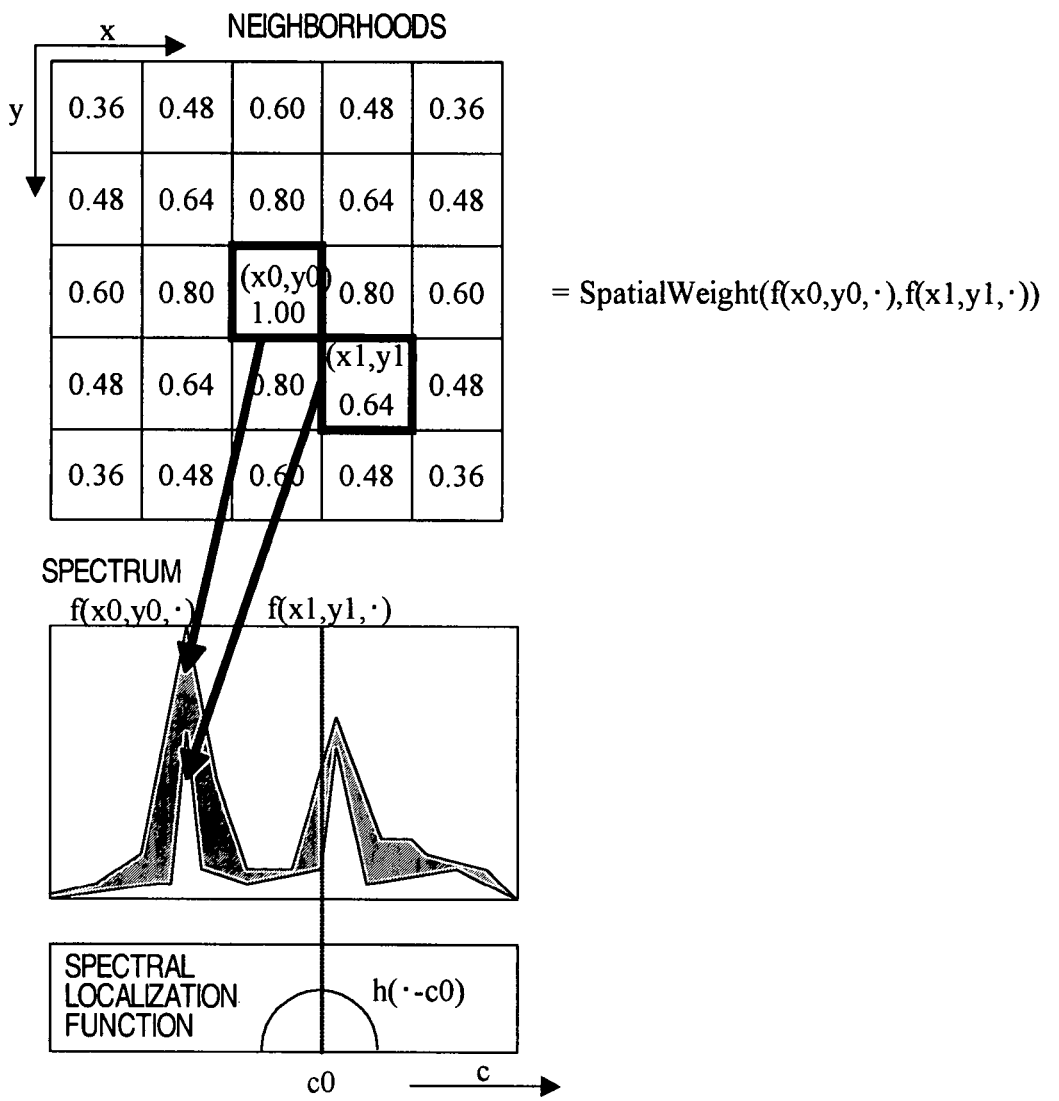
FIG. 6 is a diagram schematically showing a weight used in the spectroscopic imaging edge-preserving filter according to the first embodiment.

Five by five lattices located at the abscissa x and ordinate y shown in an upper part of FIG. 6 represent spatial weights. Here, a weight according to a position relation from a center voxel (x0, y0) is represented as a numerical value in the lattice. In this example, the size of the neighborhood from the center voxel is set to 5 by 5, the weight of (x0, y0) is set equal to 1.00 and the weight of (x1, y1) is set equal to 0.64.

In two graphs shown in lower parts of FIG. 6, the horizontal axis indicates the chemical shift c and the vertical axis indicates the signal intensity. The upper graph represents a spectrum f(x0, y0, •) at the spatial dimensions (x0, y0) and a spectrum f(x1, y1, •) at the spatial dimensions (x1, y1). A shaded part represents a difference between the two spectra. The lower graph represents a spectral localizing function h(•−c0) for localizing the calculation in order to calculate the difference by using only a local spectrum around a chemical shift c0. Here, the hamming function h(•) is indicated as the spectral localizing function. As a method for calculating similarity between two spectra, a root mean square error of square integral in a part localized around a noted point c0 is used. In other words, it is a part corresponding to a numerator of an exponential indicated by a bottom right numerical expression. The spectral weight due to similarity between spectra is obtained by dividing the difference by a square root of square integral of the spectrum f(x0, y0, •) and a square root of square integral of the spectrum f(x1, y1, •) and taking its exponential decay. As a result, the weight becomes large as the local spectra of c0 are similar, and the weight becomes small as the local spectra are different.

Setting of these weights indicates a typical example, and it is not restrictive. For example, as for the spatial weights, it is also possible to change the size of neighborhood to 3×3 and change all weights to 1.00. Furthermore, it is also possible to change the size of the neighborhood and its weights according to the signal intensity of the spectrum around c0. For example, it is possible to make a smoothing region large and improve the SNR when the signal intensity is low by conducting processing of making the neighborhood large when the signal intensity is low.

As for the spectral weights due to the similarity between spectra, it is also possible to calculate the correlation coefficient or the product of the correlation coefficient and the square integral of the difference instead of the square integral of the difference. Although the hamming function is used as the localizing function, it is also possible to use the gauss function or the like. Besides, it is also possible to remove the influence of the shift of the spectrum in the chemical shift dimension or the low SNR by conducting of smoothing the spectrum before multiplying the localizing function. In addition, it is also possible to calculate the difference in every spectrum without multiplying the localizing function or conversely causing the localizing function to have a weight on only one object point c0. In short, it is a condition for setting the edge-preserving filter to select a function that provides a higher weight as the spectra become similar.

At step 502 in FIG. 5, a spectroscopic image is acquired from the memory 22 in the data processing unit at the time of measurement, and acquired from the data storage 23 at the time of user's data processing. At step 503, a spectroscopic imaging edge-preserving filter is applied to the spectroscopic image acquired at the step 502 in accordance with the weight set at the step 501. This will be described in detail later with reference to a lower flow chart of FIG. 5. At step 504, a result of applying is output to the memory 22 or the data storage 23, or output to and displayed on the user interface 24.

Operation of the spectroscopic imaging will now be described with reference to the lower flow chart in FIG. 5.

First, at step 511, loop processing is conducted so as to conduct subsequent processing on every voxel (x0, y0, c0) of three-dimensional data. At step 512, loop processing is conducted so as to conduct processing at steps 513 to 516 in the neighborhood (x1, y1) where the spatial weight set at the step 501 is calculated. Here, the neighborhood becomes, for example, the 5×5 regions shown in an upper part of FIG. 6. In some cases, however, the neighborhood is restricted because there are no data, for example, when (x0, y0) is located at an end point of an image. In that case, only a region having data is handled as the neighborhood.

At step 513, the spatial weight depending on the positional relation between (x0, y0) and (x1, y1) is calculated. At step 514, a spectrum difference which indicates spectrum similarity is calculated from the spectrum f(x0, y0, •), the spectrum f(x1, y1, •) and the chemical shift c0. At step 515, the spectral weight corresponding to the difference is calculated. At step 516, the spectroscopic imaging weight is calculated by multiplying the spatial weight and the spectral weight.

The processing at the steps 513 to 516 is conducted at every point (x1, y1). Thereafter, at step 517, all weights of the spectroscopic imaging are added. At each point (x1, y1), a ratio of each spatio-spectral weight to the total of spatio-spectral weight is calculated.

At step 518, loop processing is conducted so as to conduct processing at step 519 at every point (x1, y1) in the neighborhood. At the step 519, weighting according to the ratio calculated for each (x1, y1) at the step 517 is executed on f(x1, y1, c0) to obtain an added value f(x0, y0, c0). The series of weighted smoothing is executed on every voxel (x0, y0, c0) by the loop processing set at the step 511.

Figure 7:
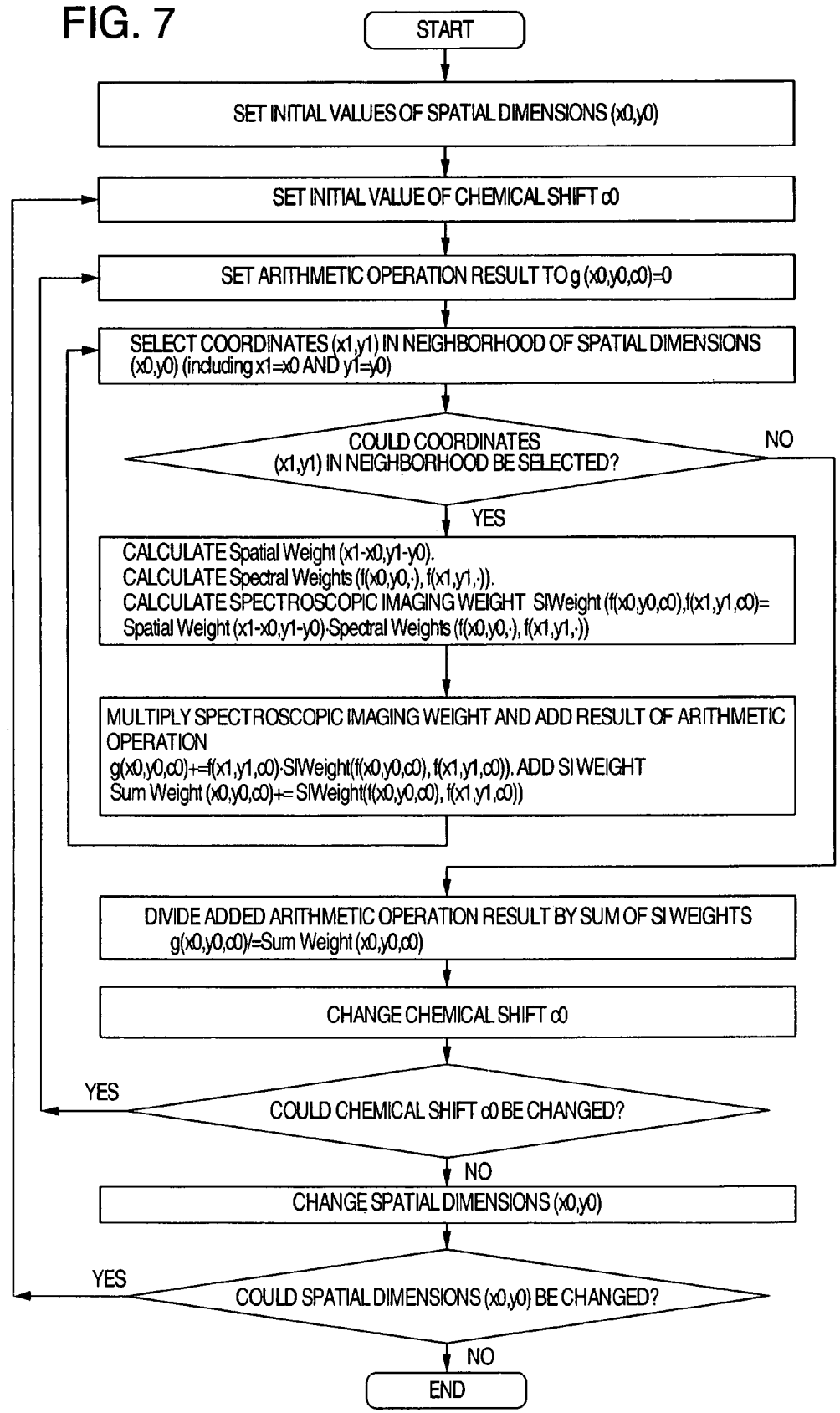
FIG. 7 is a detailed flow chart of the spectroscopic imaging edge-preserving filter according to the first embodiment.

FIG. 7 is a flow chart showing the steps 511 to 519 in further detail. It is a matter of course that a change for faster arithmetic operation such as deletion of a region that does not need calculation or a change in the loop order may be made in implementation.

In the spectroscopic imaging edge-preserving filter shown in FIGS. 5 to 7, the spatial weight is calculated and the spectral weight is multiplied by it. However, there is also a different method. For example, only the spectral weight may be calculated in the neighborhood as the weight without calculating the spatial weight. As another example, there is also a method of using a median filter instead of calculating the spatial weight. In this case, (x1, y1) at which the spectral weight has a middle value is searched for in the neighborhood, and its value f(x1, y1, c0) is taken as f(x0, y0, c0). As in the example of the median filter, it is possible to apply an edge-preserving filter used in an ordinary image, decide whether to weight by using the spectral weight or which value to select, and produce a spectroscopic imaging edge-preserving filter that produces f(x0, y0, c0) from the value f(x1, y1, c0) in the neighborhood according to weight or the decision. A great difference from the edge-preserving filter used in the ordinary image is that the value itself of each voxel is used for the weight or decision of the edge-preserving filter in the ordinary image whereas the spectrum of each voxel is used for the weight or decision in the spectroscopic imaging edge-preserving filter.

A key point of the present invention resides in the step (step 514) of applying the localizing function centering around the point c0 to the spectrum f(x0, y0, •) and the spectrum f(x1, y1, •) which are series of data in the chemical shift dimension between a plurality of voxels such as the voxels (x0, y0, c0) and (x1, y1, c1) and calculating the difference value, the steps (the steps 515 and 517) of converting the difference value to weight information, and the step (the step 519) of conducting smoothing on data between voxels by using the weight information.

Figure 8:
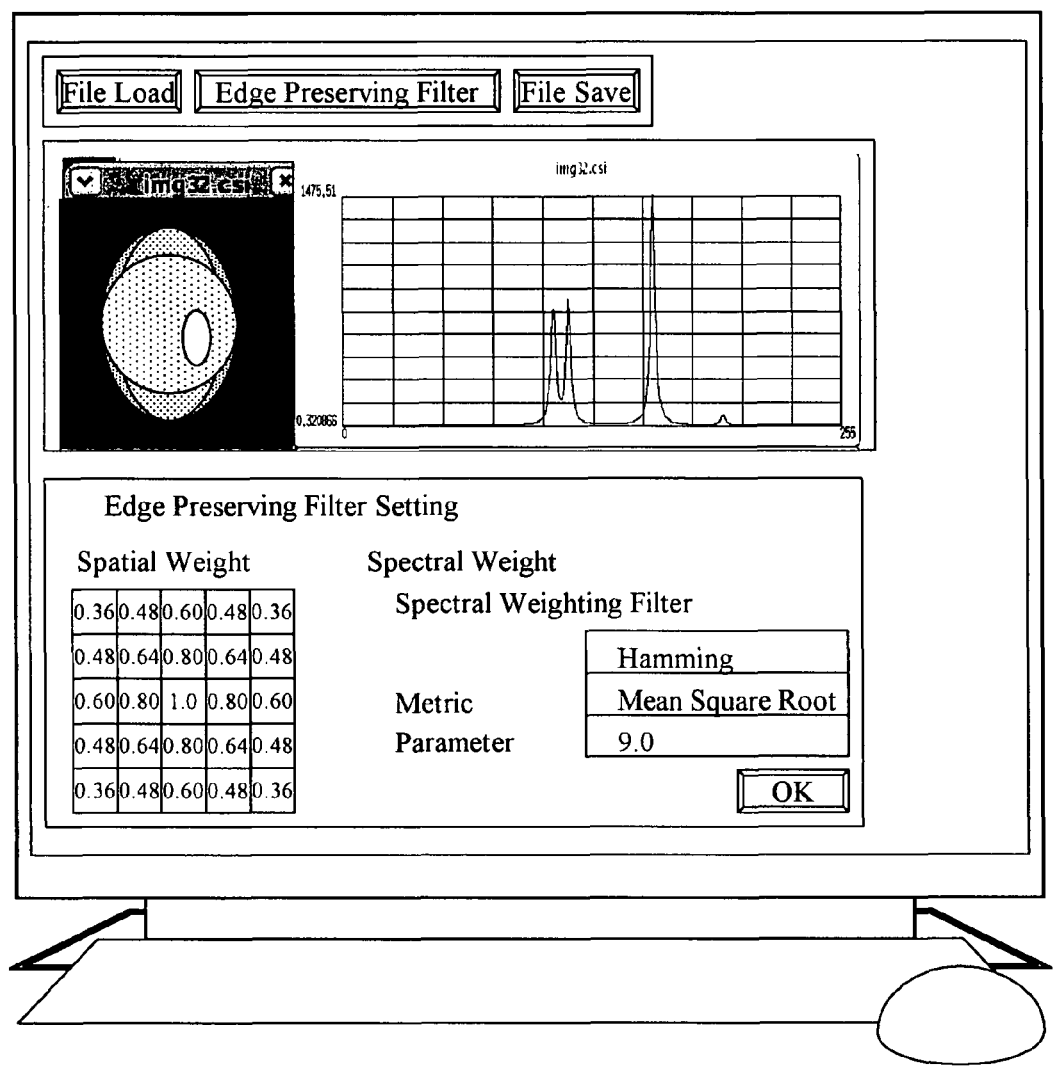
FIG. 8 is a diagram showing a screen example of the spectroscopic imaging edge-preserving filter according to the first embodiment.

FIG. 8 shows an example of a screen used when the user conducts data processing. FIG. 8 shows how the user interface 24 in the data processing unit is used. On a top part of the screen, a button "File Load" for acquiring data from the data storage 23 and a button "Edge Preserving Filter" for applying the edge-preserving filter to the acquired data are arranged. The data processing unit 20 accepts a control signal input by the user by using an input device such as a keyboard or a mouse. When the button "File Load" is pressed, the data processing unit 20 displays a screen for data selection. According to the user's selection, necessary data is acquired from the data storage 23 by using the memory 22 or using the data storage 23 as well when the data is large in quantity. The acquired data is displayed by using a gray level image and a one-dimensional graph shown in a middle part of FIG. 8. When the user has depressed the button "Edge Preserving Filter," a setting screen required to set the edge-preserving filter and shown in a lower part of FIG. 8 is displayed to accept the user's input. When a button "OK" is pressed, the above-described spectroscopic image edge-preserving filter is applied. Its result is displayed in the middle part of the screen. When a button "File Save" is pressed, the result is stored in the data storage 23. Here, the screen for setting the edge-preserving filter on occasion is displayed. When conducting processing by using only predetermined setting, however, such a setting screen is not needed. It is a matter of course that such a screen for the user is not needed when the setting is incorporated in the data processing of measured data and the edge-preserving filter processing is conducted automatically.

Effects of the present edge-preserving filter will now be described with reference to FIGS. 9 to 13.

Figure 9:
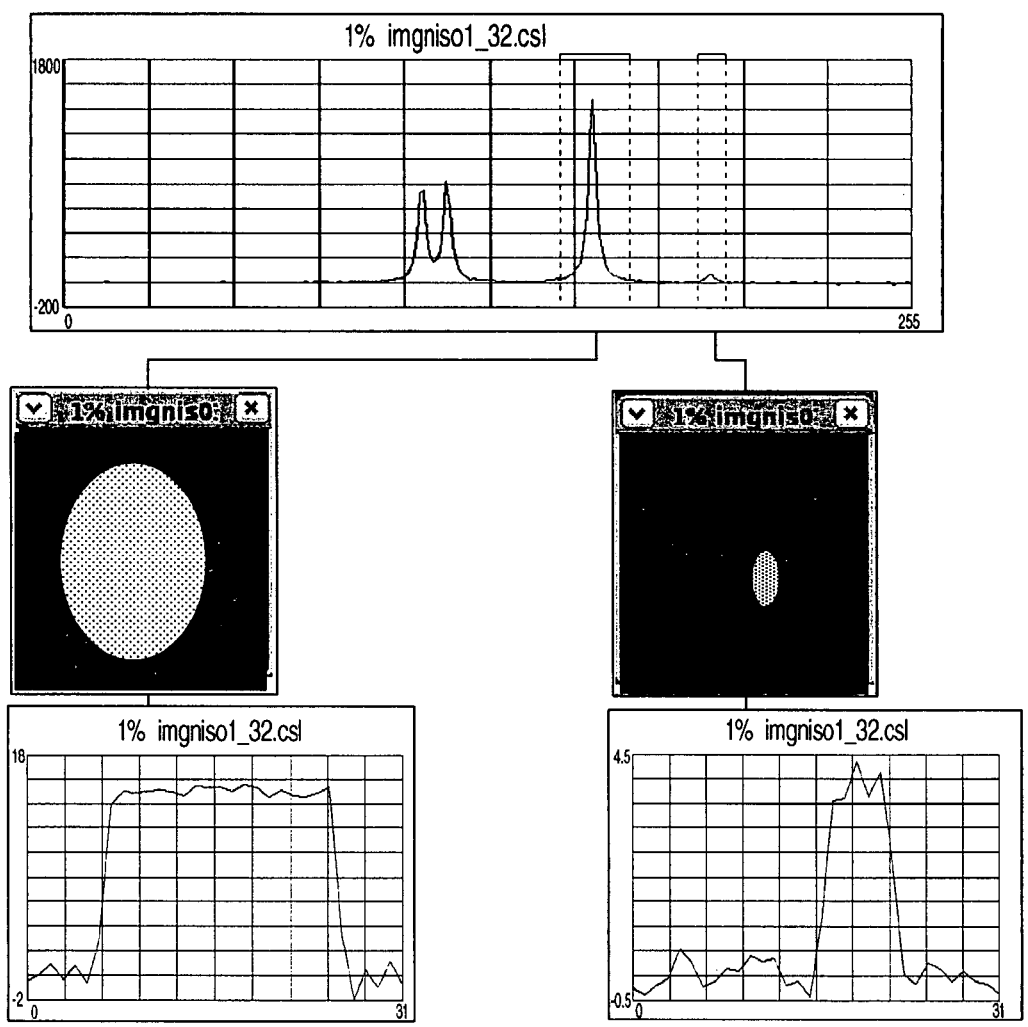
FIG. 9 is a diagram showing simulation data used to evaluate the present invention.

FIG. 9 shows simulation data for evaluating the present filter. The present data simulate 1H spectroscopic imaging of a brain, and they are produced by adding 10% noise to original data having a simple structure. In the spatial dimension, 32×32 voxels are included, and in the chemical shift dimension, 256 voxels are included. Although each voxel has a complex number value, only the real part is shown in FIG. 9. The imaginary part forms substantially only noise in production of simulation data.

A top part of FIG. 9 represents a spectrum in the whole space. A gray level image obtained by adding regions of a peak of lactate at the rightmost end, and a gray level image obtained by adding regions of a peak of NAA (N-acetyl aspartate) located on the left side thereof are shown in the middle part of FIG. 9. In order to make a change of the gray level image easy to see, the bottom part shows a profile at a seventeenth point from above in the x direction.

Figure 10:
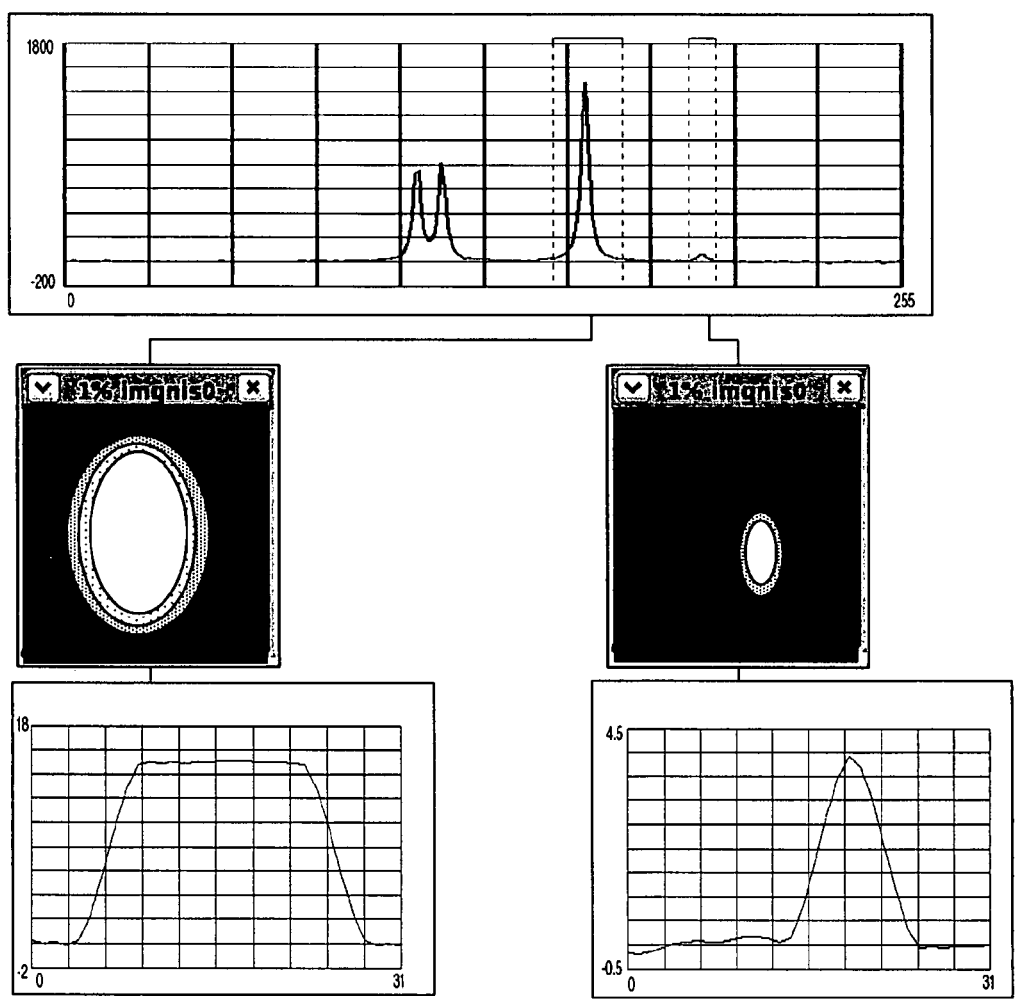
FIG. 10 is a diagram showing data to which a conventional linear interpolation filter is applied.

FIG. 10 shows a result obtained by calculating a spatial moving average on simulation data shown in FIG. 9. When calculating the moving average, the spatial weights shown in FIG. 6 are used. As shown by the profiles on the bottom part, it is appreciated that the spatial resolution remarkably falls in both NAA and lactate.

Figure 11:
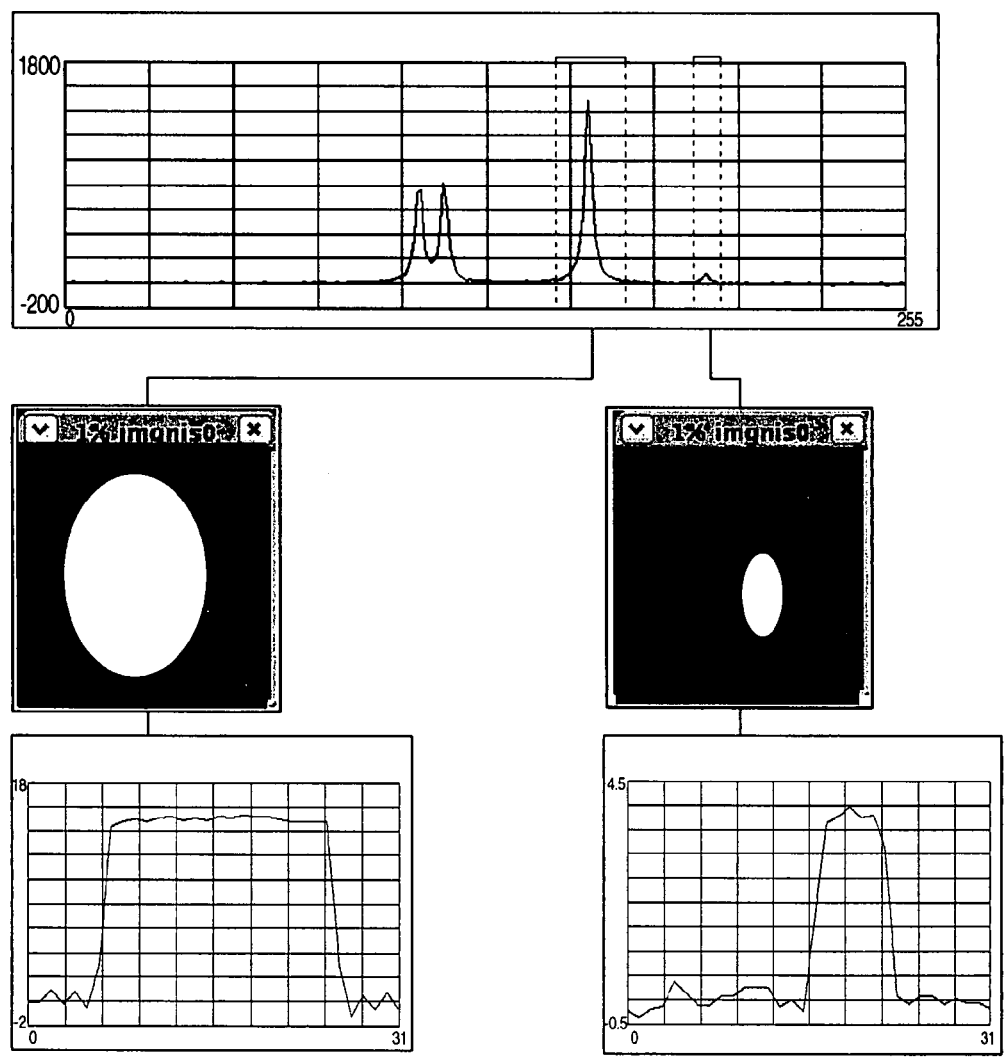
FIG. 11 is a diagram showing data to which a spectroscopic imaging edge-preserving filter according to the present invention is applied.

FIG. 11 shows a result obtained by applying the spectroscopic imaging edge-preserving filter according to the present invention. The spatial weights and spectral weights shown in FIG. 6 are used. However, the localizing function in the spectrum dimension is provided with seven serial points. It is appreciated that the SNR is improved as compared with FIG. 9 and the spatial resolution degrades less as compared with FIG. 10. In addition, it is appreciated from the top part of FIG. 11 that the spectrum resolution does not fall.

Figure 12:
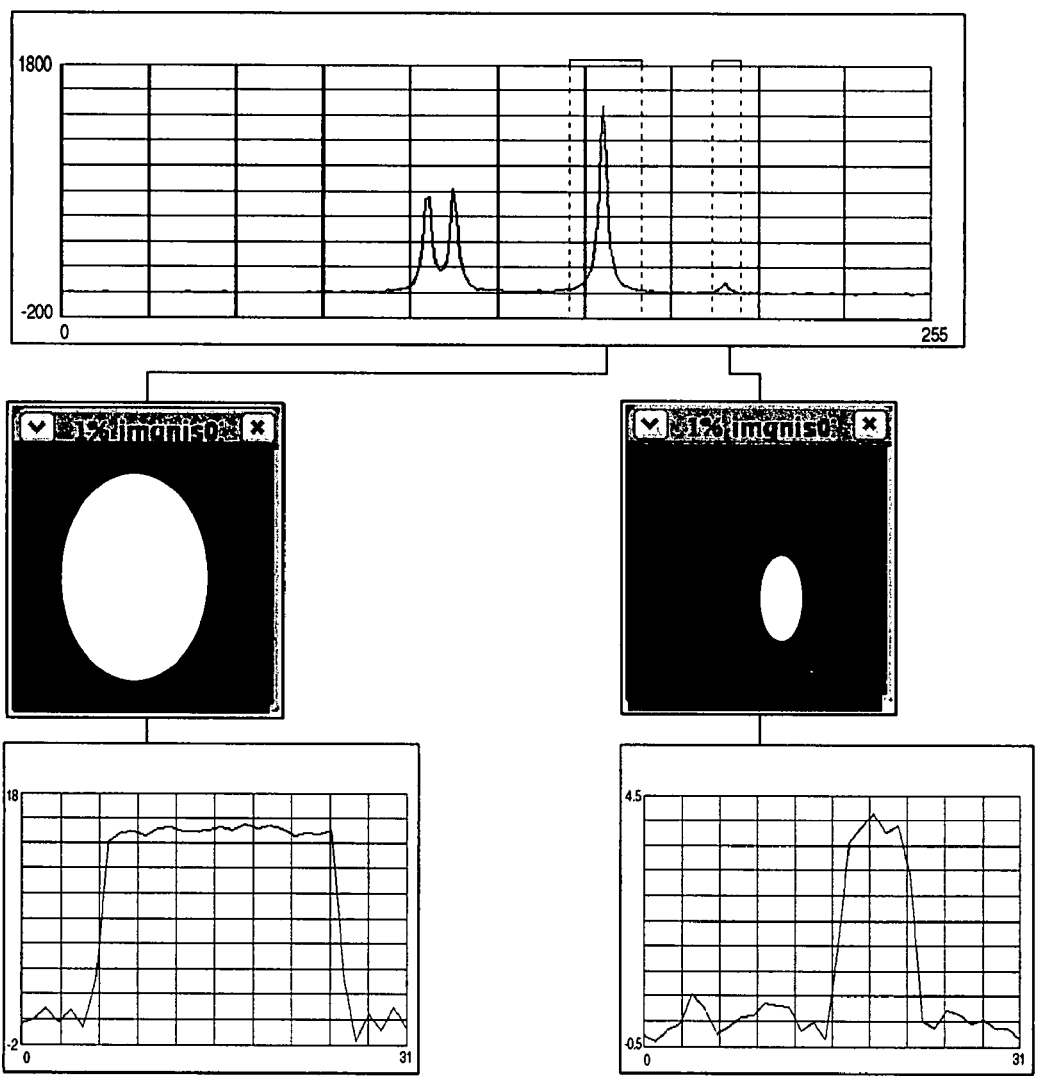
FIG. 12 is a diagram showing data to which another spectroscopic imaging edge-preserving filter according to the present invention is applied.
Figure 13:
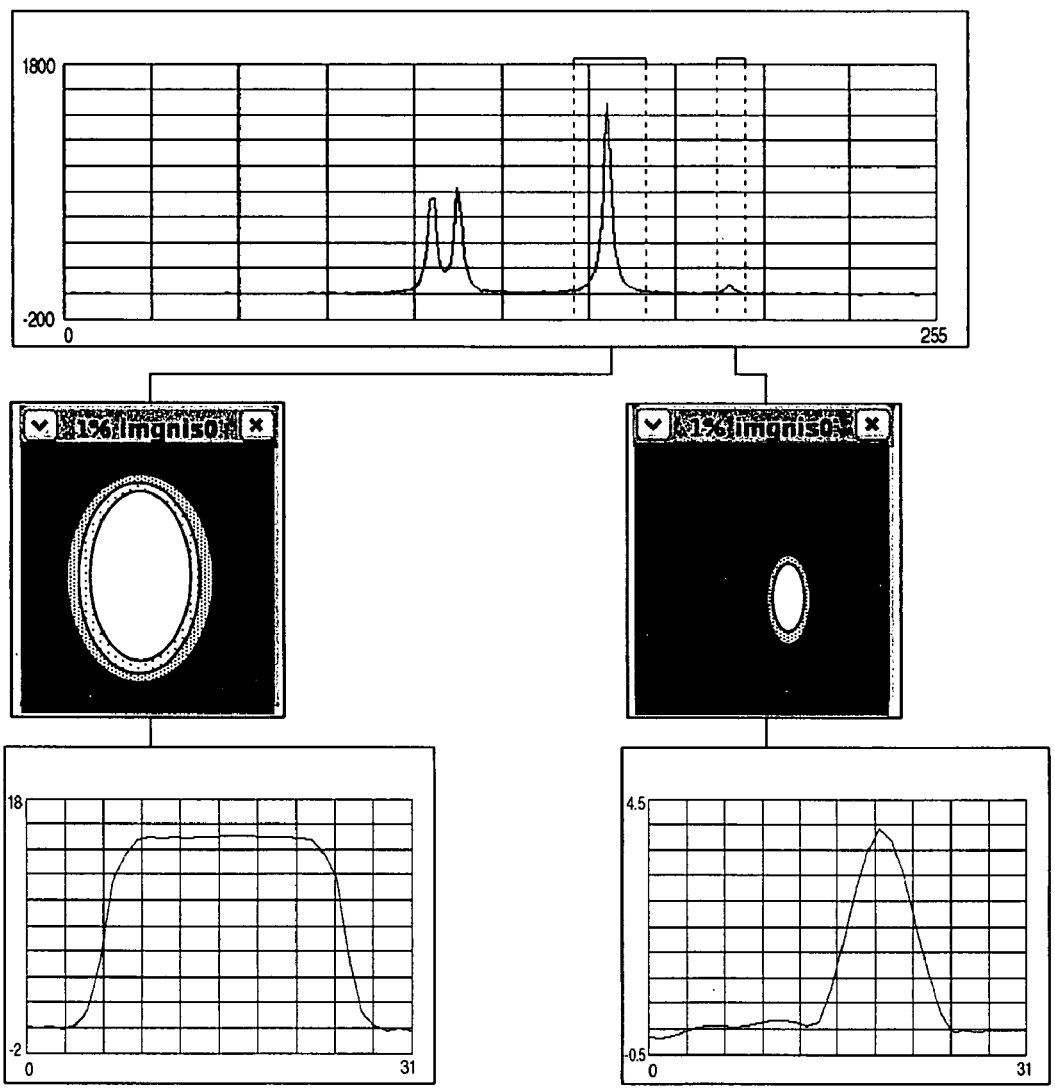
FIG. 13 is a diagram showing data to which another spectroscopic imaging edge-preserving filter according to the present invention is applied.

FIG. 12 and FIG. 13 compare effects of the localizing function in the spectrum dimension. FIG. 12 shows a case where only one point c0 is used as the localizing function in the spectrum dimension. It is appreciated from the bottom part of FIG. 12 that the improvement of the SNR is lower than that in FIG. 9. It is considered that in voxels around the peak where the signal falls from the peak and becomes smaller the peripheral spectral weights become small and the SNR cannot be lowered effectively. Since the localizing function is confined to one point, however, there is an effect that the arithmetic operation time can be shortened. As for FIG. 13, the spectral weights are calculated conversely by using the whole region of the spectrum without using the localizing function. In this case, it is appreciated from the bottom part of FIG. 13 that the fall of the spatial resolution of lactate is more remarkable than the fall of the spatial resolution of NAA. This is considered to be caused by the fact that the distribution of lactate having a low signal intensity is weighted according to the distribution of NAA having a high signal intensity because the spectrum similarity is calculated over the whole region of the spectrum. Since the spectral weights do not change even if the chemical shift c0 is changed, however, there is an effect that the arithmetic operation time can be shortened.

If it is taken into consideration that the distribution differs according to the molecule, it is considered to be better to multiply a local function in the chemical shift dimension and calculate the difference in spectrum. Furthermore, it is considered that the range should be taken wide to some extent according to the SNR that is not affected by the peak of other molecules. Even if the spectroscopic image is three-dimensional data, there is a possibility that the spectrum resolution will fall if an edge-preserving filter of ordinary image is applied as the spatial three-dimensional filter. Therefore, it is considered that the present invention method can increase the SNR while holding the spectral resolution.

Figure 14:
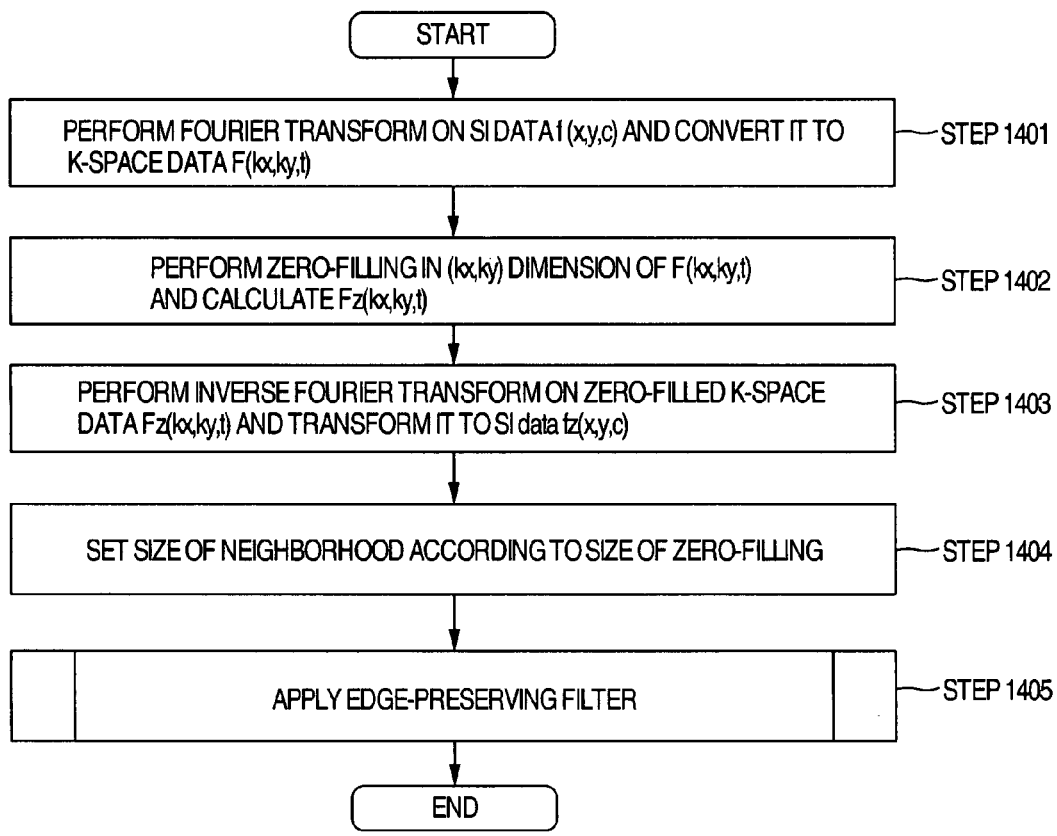
FIG. 14 is a flow chart of a spectroscopic imaging edge-preserving filter combined with zero-filling according to the present invention.

FIG. 14 is a flow chart showing processing conducted in the edge-preserving filter combined with zero-filling to improve the spatial resolution. First at step 1401, spectroscopic imaging data f(x, y, c) is subject to Fourier transform to be converted to k-space data F(kx, ky, t). At step 1402, zero-filling is conducted in the (kx, ky) dimension to form Fz(kx, ky, t). At this time, zero-filling may be conducted in the time direction at the same time. At step 1403, the zero-filled data Fz(kx, ky, t) is subject to inverse Fourier transform to calculate spectroscopic imaging data fz(x, y, c). At step 1404, the size of the neighborhood is set according to the size of zero-filling. For example, if zero-filling to twice is conducted, the size of the neighborhood is set to at least 3×3 (at least 5×5) in order to reduce the influence of Gibbs ringing simultaneously. If zero-filling is conducted in a larger size, the neighborhood is set to a larger size. Finally, at step 1405, the above-described spectroscopic imaging edge-preserving filter is applied to fz(x, y, c). By the way, instead of zero-filling, it is also possible to conduct combination with linear prediction described in the JP-A-2001-8919. As a result, an effect of further lowering the Gibbs ringing is obtained.

Figures 15A, 15B, 15C:
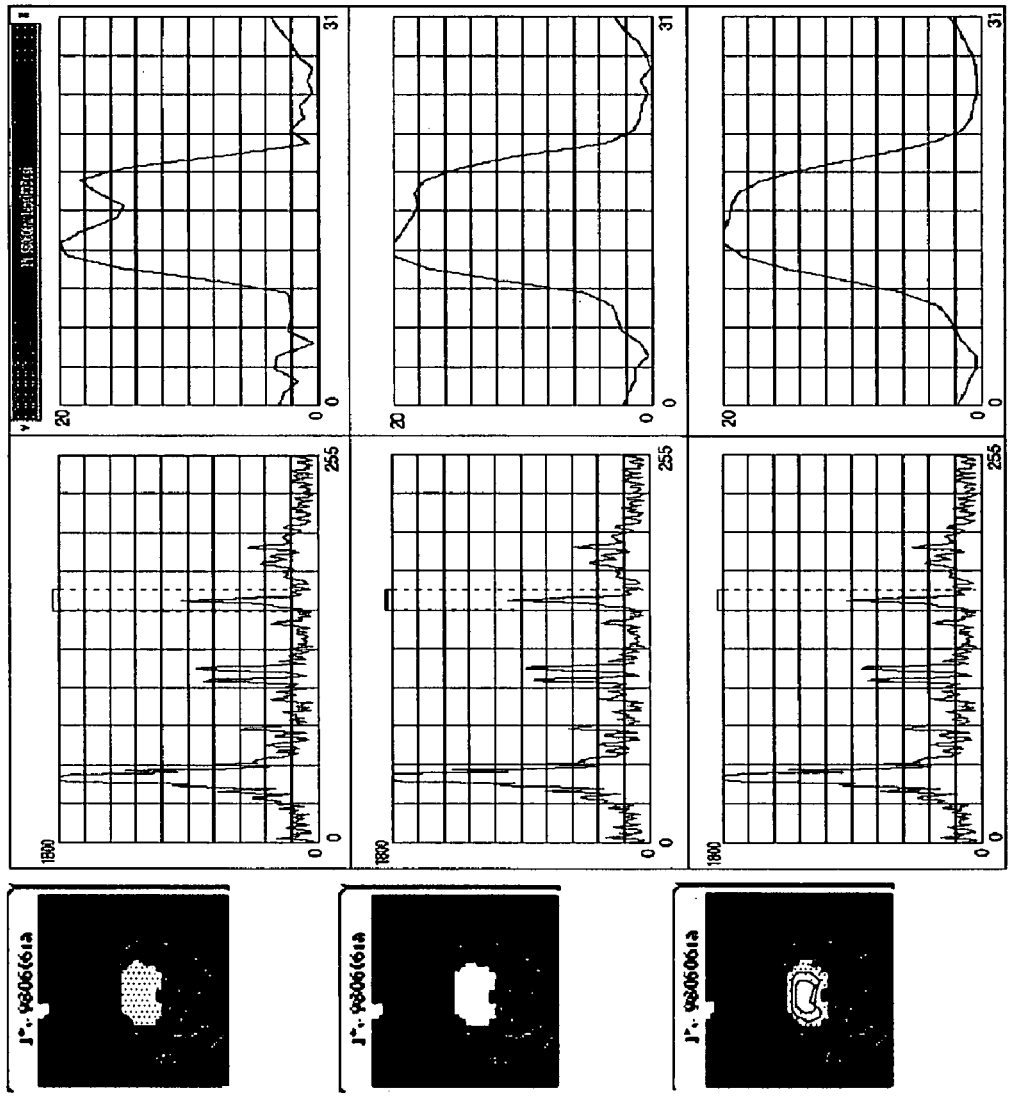
FIGS. 15A-15C are diagrams showing results obtained by evaluating the present invention with actual measured data.

FIGS. 15A-15C are diagrams showing results obtained by evaluating data processing conducted by combining zero-filling and the edge-preserving filter according to the present invention. The present data is obtained by performing echo-planar spectroscopic imaging on a rat brain with a magnetic resonance imaging system. There are 15×15 points in the spatial dimension and 256 points in the temporal dimension. An image shown in FIG. 15A is a spectroscopic image obtained by executing only zero-filling on 32×32 points in the spatial dimension. The leftmost image is a density image of NAA. A central graph represents the spectrum in the whole space. A rightmost graph represents a profile along the x-direction at a point y=17. FIG. 15B shows a result obtained by applying the edge-preserving filter according to the present invention. FIG. 15C shows a result obtained by calculating a spatial moving average. As a result, it is appreciated that the present invention method reduces the Gibbs ringing and improves the SNR and the fall in spatial resolution is also less than that in the spatial moving average shown in FIG. 15C.

As heretofore described, it becomes possible to improve the SNR while suppressing the decrease of the spatial resolution if the spectroscopic imaging edge-preserving filter according to the present invention is used. There is also an effect that the resolution in the spectrum dimension is not lowered at this time. Furthermore, there is also an effect that the Gibbs ringing can be suppressed while improving the apparent spatial resolution by combination with zero-filling.

If the spectroscopic imaging edge-preserving filter heretofore described is used for medical diagnosis, it becomes possible to obtain metabolite distribution having a high SNR without degradation in the spatial resolution. It becomes possible to conduct cancer tissue classification or ischemia tissue classification with higher precision than that of the conventional classification using relaxation time of water, by observing metabolites such as lactate, NAA, creatine and choline. Especially, according to the present method, the SNR can be improved without degradation in spatial resolution. Therefore, there is also an effect that classification of minute tissues is not made difficult by a partial volume effect.

According to the present invention, a magnetic resonance imaging system and a magnetic resonance data processing unit capable of conducting spectroscopic imaging with an improved SNR without degrading the spatial resolution are provided. According to the present invention, a high effect that the spatial resolution of a molecule having a low signal intensity can also be held is obtained, because an edge preserving filter which improves the SNR without degrading the spatial resolution is applied to each molecule. Furthermore, it is possible to obtain an effect that the resolution in the spectrum dimension is not degraded which is important when separating the molecule. If the magnetic resonance imaging system according to the present invention is used as a medical diagnosis system, therefore, it is also possible to obtain an effect that a difference in metabolite can be distinguished on the basis of a difference in metabolic function between a normal tissue and a disease tissue and consequently a high precision diagnosis is made possible.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A magnetic resonance imaging system comprising data processing means of magnetic resonance data,
    wherein the data processing means comprises edge-preserving filter processing means for spectroscopic imaging, and
    the edge-preserving filter processing means for spectroscopic imaging executes processing comprising the steps of:
    calculating spectral similarity in spatial neighborhoods (spatially neighboring voxels) at each voxel in spectroscopic imaging data, which comprises calculating similarity in only a local spectrum concerning a chemical shift component of each voxel in the spectroscopic imaging data;
    calculating a spatial weight according to a spatial position relation between each voxel and the neighborhood;
    calculating a spectral weight according to the spectral similarity;
    multiplying the spatial weight and the spectral weight and calculating a spatio-spectral weight; and
    conducting weighted smoothing for compounding spectra of spatial neighborhoods (spatially neighboring voxels) according to the spatio-spectral weight.

2. The magnetic resonance imaging system according to claim 1, wherein the spectral similarity calculating step comprises calculating similarity by using a root mean square error (RMSE) defined on a spectrum or a RMSE defined on a local spectrum.

3. The magnetic resonance imaging system according to claim 1, wherein the spectral similarity calculating step comprises calculating similarity by using a root mean square error (RMSE) defined on a spectrum or a RMSE defined on a local spectrum.

4. A magnetic resonance imaging system comprising data processing means of magnetic resonance data,
    wherein the data processing means comprises edge-preserving filter processing means for spectroscopic imaging, and
    the edge-preserving filter processing means for spectroscopic imaging executes processing comprising the steps of:
    calculating spectral similarity in spatial neighborhoods (spatially neighboring voxels) at each voxel in spectroscopic imaging data, which comprises calculating similarity in only a local spectrum concerning a chemical shift component of each voxel in the spectroscopic imaging data;
    calculating a spectral weight according to the spectral similarity; and
    conducting weighted smoothing for compounding spectra of spatial neighborhoods (spatially neighboring voxels) according to the spectral weight.

5. The magnetic resonance imaging system according to claim 4, wherein the spectral similarity calculating step comprises calculating similarity by using a root mean square error (RMSE) defined on a spectrum or a RMSE defined on a local spectrum.

6. The magnetic resonance imaging system according to claim 4, wherein the spectral similarity calculating step comprises calculating similarity by using a root mean square error (RMSE) defined on a spectrum or a RMSE defined on a local spectrum.

7. The magnetic resonance imaging system according to claim 4, wherein the edge-preserving filter processing means for spectroscopic imaging executes processing comprising the steps of:
- performing a Fourier transform on spectroscopic imaging data and thereby transforming the spectroscopic imaging data to k-space data;
- performing zero-filling in the k-space; and
- performing inverse Fourier transform on resultant data.

8. A magnetic resonance imaging system comprising:
- static magnetic field generating means for generating a static magnetic field;
- transmit means for transmitting a radio frequency electromagnetic field to a measurement object placed in the static magnetic field;
- receive means for receiving a magnetic resonance signal from the measurement object; and
- data processing means for generating spectroscopic imaging data of the measurement object by using the magnetic resonance signal received by the receive means,
- wherein the data processing means executes processing comprising the steps of:
- applying a spectral localizing function to a spectrum which is a series of data in a chemical shift dimension among a plurality of voxels and thereby calculating a difference value;
- transforming the difference value with the localizing function applied thereto to a weighting value; and
- conducting smoothing processing on data of a plurality of voxels according to the weighting value.

* * * * *